United States Patent
Chen

[19]

[11] Patent Number: 6,140,182
[45] Date of Patent: Oct. 31, 2000

[54] NONVOLATILE MEMORY WITH SELF-ALIGNED FLOATING GATE AND FABRICATION PROCESS

[75] Inventor: Chiou-Feng Chen, Cupertino, Calif.

[73] Assignee: Actrans System Inc., Santa Clara, Calif.

[21] Appl. No.: 09/255,360

[22] Filed: Feb. 23, 1999

[51] Int. Cl.[7] .................................................. H01L 21/336
[52] U.S. Cl. ........................ 438/259; 438/296; 438/424
[58] Field of Search .................................. 438/257, 261, 438/262, 264, 266, 258, 259

[56] References Cited

U.S. PATENT DOCUMENTS

| | | |
|---|---|---|
| 4,698,787 | 10/1987 | Mukherjee et al. . |
| 4,794,565 | 12/1988 | Wu et al. . |
| 5,029,130 | 7/1991 | Yeh . |
| 5,284,784 | 2/1994 | Manley . |
| 5,402,371 | 3/1995 | Ono . |
| 5,455,792 | 10/1995 | Yi . |
| 5,467,808 | 11/1995 | Chang et al. ...................... 365/185.01 |
| 5,500,384 | 3/1996 | Melzner . |
| 5,643,812 | 7/1997 | Park . |
| 5,661,055 | 8/1997 | Hsu et al. ................................ 438/259 |
| 5,767,005 | 6/1998 | Doan et al. . |
| 5,770,501 | 6/1998 | Hong ........................................ 438/264 |
| 5,792,670 | 8/1998 | Pio et al. . |
| 5,847,996 | 12/1998 | Guterman et al. . |
| 5,937,308 | 8/1999 | Gardener et al. ...................... 438/424 |
| 5,966,615 | 10/1999 | Fazan et al. ............................ 438/424 |
| 5,972,752 | 10/1999 | Hong ....................................... 438/264 |

*Primary Examiner*—Carl Whitehead, Jr
*Assistant Examiner*—David Goodwin
*Attorney, Agent, or Firm*—Flehr Hohbach Test Albritton & Herbert LLP

[57] ABSTRACT

Nonvolatile memory cell and process in which isolation oxide regions are formed on opposite sides of an active area in a substrate to a height above the substrate on the order of 80 to 160 percent of the width of the active area, a gate oxide is formed over the active area, a first layer of silicon is deposited on the gate oxide and along the sides of the isolation oxide regions to form a floating gate having a bottom wall which is substantially coextensive with the gate oxide and side walls having a height on the order of 80 to 160 percent of the width of the bottom wall, a dielectric film is formed on the floating gate, and a second layer of silicon is deposited on the dielectric film and patterned to form a control gate which is capacitively coupled with the floating gate.

10 Claims, 12 Drawing Sheets

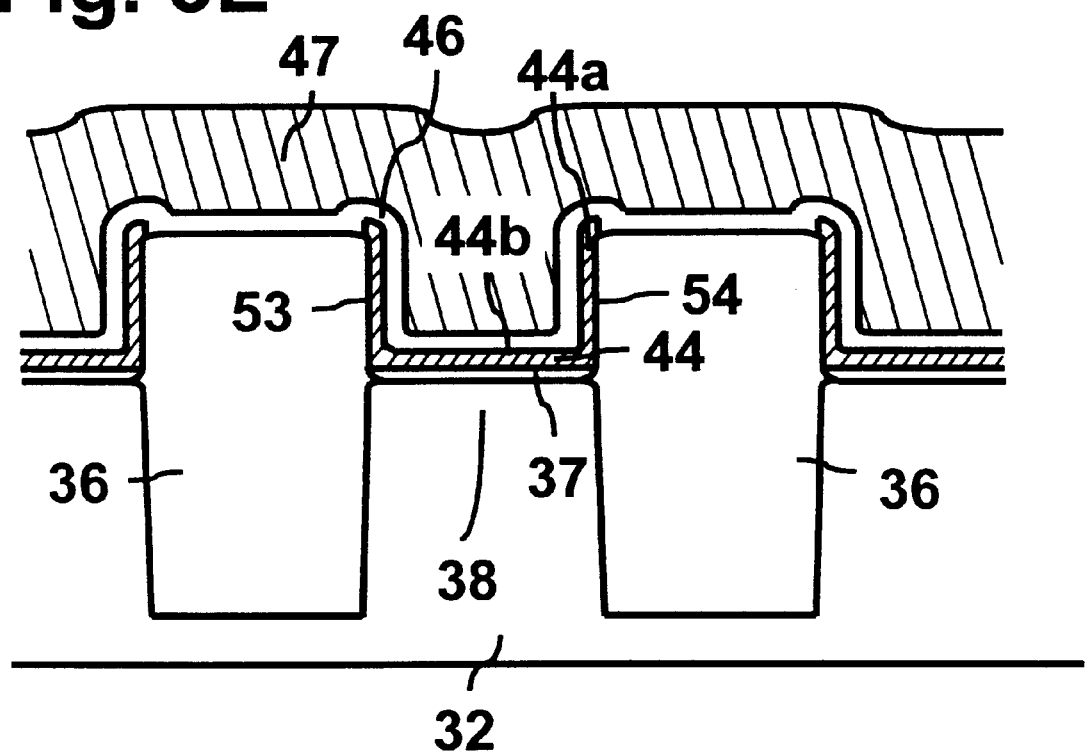

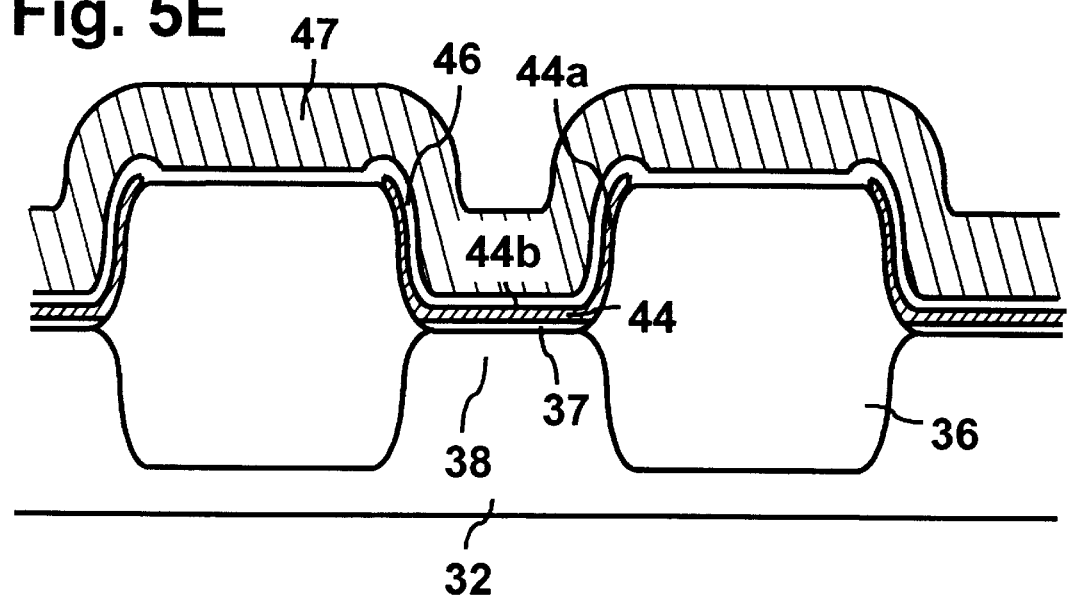

NONVOLATILE MEMORY WITH SELF-ALIGNED FLOATING GATE AND FABRICATION PROCESS

This invention pertains generally to semiconductor devices and, more particularly, to a nonvolatile memory device with a self-aligned floating gate and a process for fabricating the same.

Nonvolatile memory devices currently in use for retaining stored data during periods when no power is applied include PROM (programmable read only memory), EPROM (electrically programmable read only memory), EEPROM (electrically erasable programmable read only memory), and flash EEPROM devices.

EPROM, EEPROM and flash EEPROM devices have an advantage over PROM devices in that the data stored in them can be erased and rewritten. In EPROM devices, the data is erased by exposure to UV light, and in EEPROM and in flash EEPROM devices, it is erased electrically. Flash EEPROM devices differ from EEPROM devices in that the data can be erased in blocks ranging in size from 128 to 64K bytes, rather than on a byte-by-byte basis.

As illustrated in FIG. 1, in EPROM, EEPROM and flash EEPROM devices, the memory cells 11 generally have a floating gate 12 and a control gate 13. The floating gate is located above a thin gate oxide 14 in the active region 16 where the source, drain and channel regions are formed. The control gate is located above the floating gate, with a dielectric layer 17 between the two.

Heretofore, in most devices of this type, the floating gate has been formed by thermally growing the gate oxide 14 on the active areas 16 of a silicon substrate 18 between isolation oxide regions 19 which separate adjacent ones of the memory cells 11. A conductive layer 20 is then formed on the gate oxide, and a dielectric film 21 is formed on the conductive layer. A mask is formed photolithographically on the dielectric film, and the dielectric film and the conductive layer are etched away anisotropically in the unmasked areas to form the floating gate pattern. A second conductive layer 22 is then formed over the dielectric layer, masked and etched away to form the control gate pattern.

The floating gates 12 which are formed in this manner have caps 23, 24 which extend over the isolation oxide regions 19. These caps are necessary in order to provide increased capacitive coupling between the control gates and the floating gates, which is important in a memory cell because it provides more voltage from the control gates to the floating gates during write and erase operations. The end caps are also required in order to provide tolerance for corner rounding and shifting of the floating gate patterns relative to the isolation oxide regions during the photolithographic masking step. As illustrated in FIG. 2, rounded corners 26 reduce the size of the caps, the shifting of the patterns creates an asymmetry in which the cap 23 on one side of the floating gate overlies a substantially greater portion of the isolation oxide than the cap 24 on the other side. As a result, the channel lengths 27, 28 beneath the floating gates become shorter and uncontrollable, particularly when the corner rounding and pattern shifting both occur and the effects of the two combine.

In order to prevent the floating gates from presenting a short channel or punch-through effect, the floating gate caps must be made wider to tolerate process variations. That has a significant disadvantage from the standpoint of cell size in that it requires the cells to be larger in order to have enough space for the caps themselves and enough space between the floating gates of adjacent cells to prevent shorts between them. U.S. Pat. No. 5,767,005 describes a process for fabricating a self-aligned floating gate which does not have caps overlying the isolation, or field, oxide. In this process, the floating gate is formed by depositing a conductive layer over the field oxide as well as in a recess formed in the field oxide over the active region of the substrate. The conductive layer is then planarized by a step such as chemical mechanical planarization (CMP) until the top the conductive material is coplanar with the upper surface of the field oxide and the material is left only in the recess. The floating gate is thus self-aligned, with the inner wall of the recess defining the peripheral shape of the gate. While this process does eliminate the need for a critical masking step in the formation of the floating gate, it has the disadvantage of applying CMP polishing directly to the polysilicon or other conductive material from which the floating gate is formed. In addition, the floating gate is relatively short and provides only limited coupling with the control gate.

It is in general an object of the invention to provide a new and improved semiconductor device and fabrication process.

Another object of the invention is to provide a semiconductor device and process of the above character which overcome the limitations and disadvantages of the prior art.

These and other objects are achieved in accordance with the invention by providing a nonvolatile memory cell and process in which isolation oxide regions are formed on opposite sides of an active area in a substrate to a height above the substrate on the order of 80 to 160 percent of the width of the active area, a gate oxide is formed over the active area, a first layer of silicon is deposited on the gate oxide and along the sides of the isolation oxide regions to form a floating gate having a bottom wall which is substantially coextensive with the gate oxide and side walls having a height on the order of 80 to 160 percent of the width of the bottom wall, a dielectric film is formed on the floating gate, and a second layer of silicon is deposited on the dielectric film and patterned to form a control gate which is capacitively coupled with the floating gate.

FIGS. 3A–3E are schematic cross sectional views illustrating the steps in one embodiment of a process for fabricating a stack-gate or split-gate memory cell using shallow trench isolation in accordance with the invention.

FIGS. 5A–5E are schematic cross sectional views illustrating the steps in another embodiment of a process for fabricating a stack-gate or splitgate memory cell using LOCOS isolation in accordance with the invention.

Figure 1:
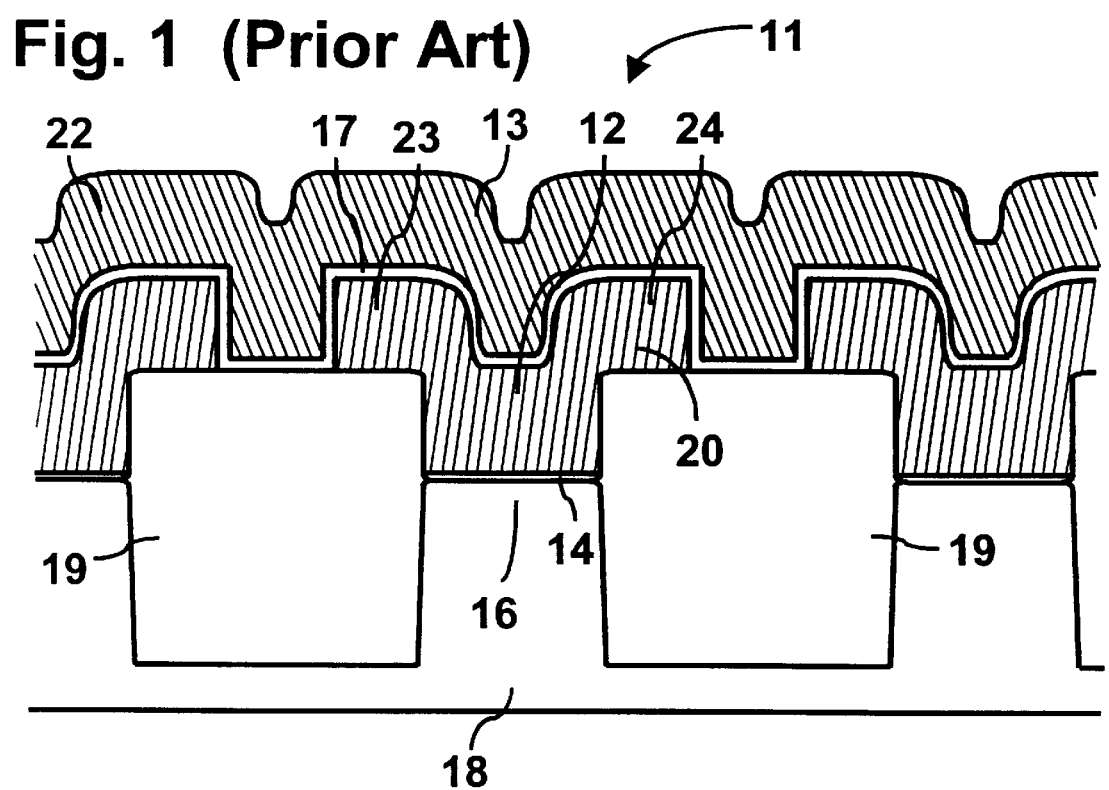
FIG. 1 is a schematic cross sectional view of a floating gate memory device of the prior art.
Figure 2:
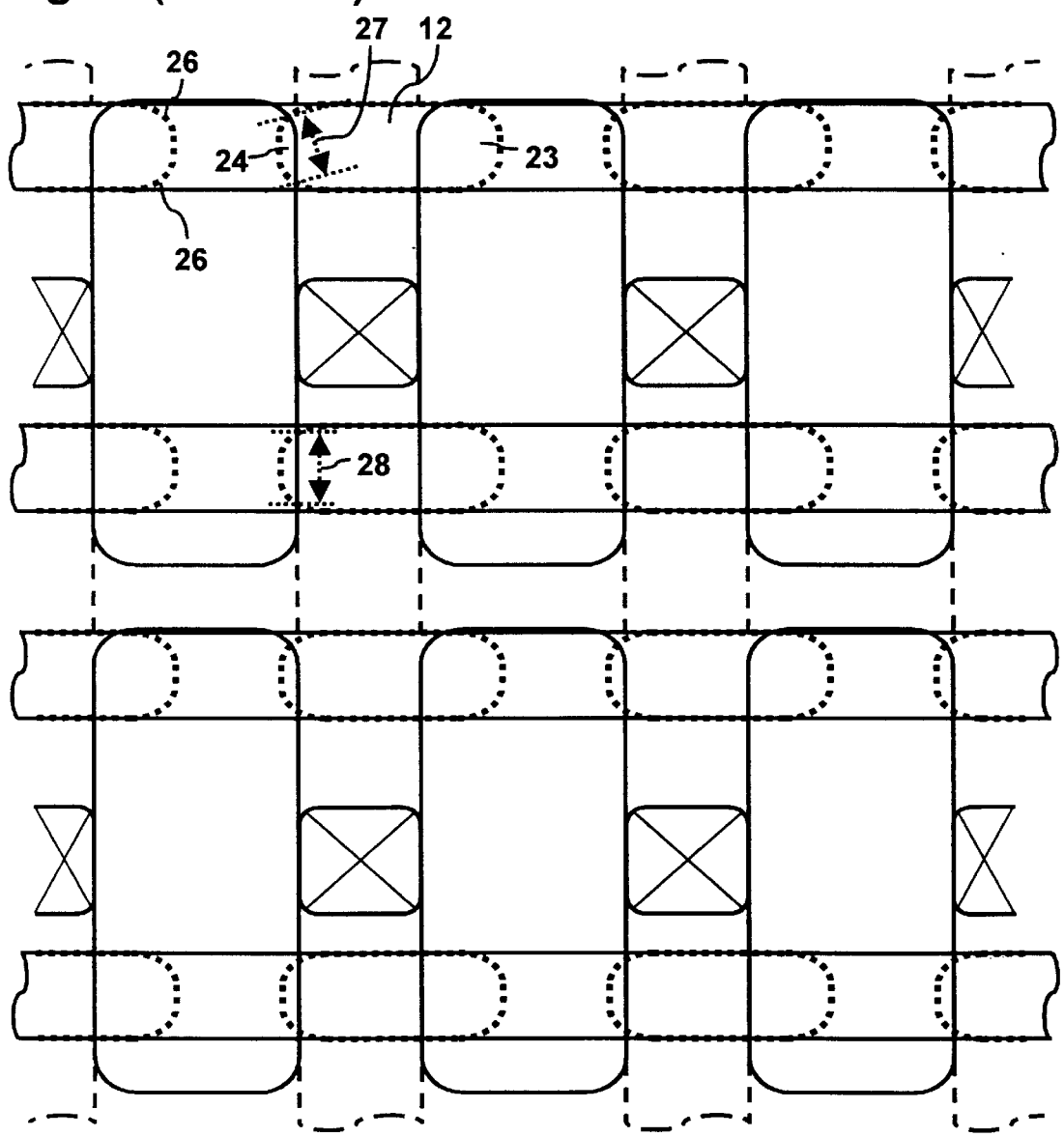
FIG. 2 is a schematic top plan view of the memory device of FIG. 1.
Figure 3A:
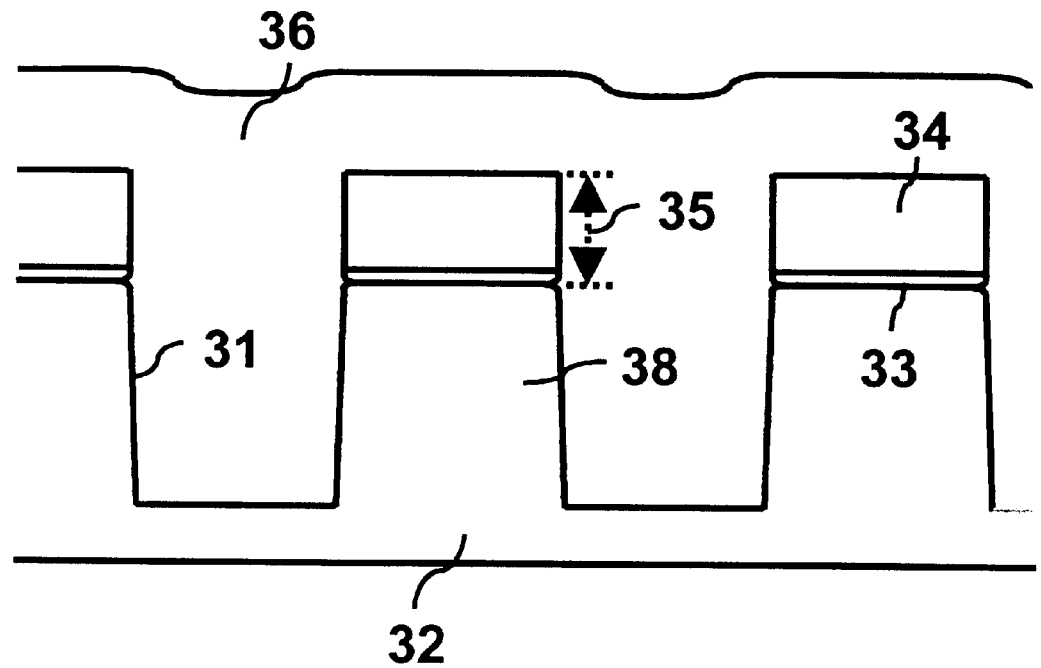

As illustrated in FIG. 3A, shallow trenches 31 are formed in a silicon substrate 32. The silicon can be an N-well material, a P-well material or simply a P-type material. A pad oxide 33 is formed on the substrate, and a silicon nitride layer 34 is deposited on the pad oxide. These layers are patterned to form a mask, and the substrate is etched through the mask to form the trenches.

An isolation oxide 36 is then deposited in the trenches and planarized so that it is level with the upper surface of the nitride layer. The oxide can, for example, be deposited by chemical vapor deposition (CVD), and planarized by CMP polishing. In this process, pad oxide 33 and nitride layer 34 serve not only as a mask for forming the trenches, but also as a means for building up the height of the isolation oxide. As discussed more fully hereinafter, the step height 35 (i.e. the height of the upper surface of the nitride layer above the upper surface of the silicon substrate) is important because it provides the floating gate with a large side wall along the edge of the isolation oxide, which increases the capacitance between the control gate and the floating gate. With a large coupling ratio, more voltage is coupled from the control gate to the floating gate during write and erase operations of the memory cell.

Figure 3B:
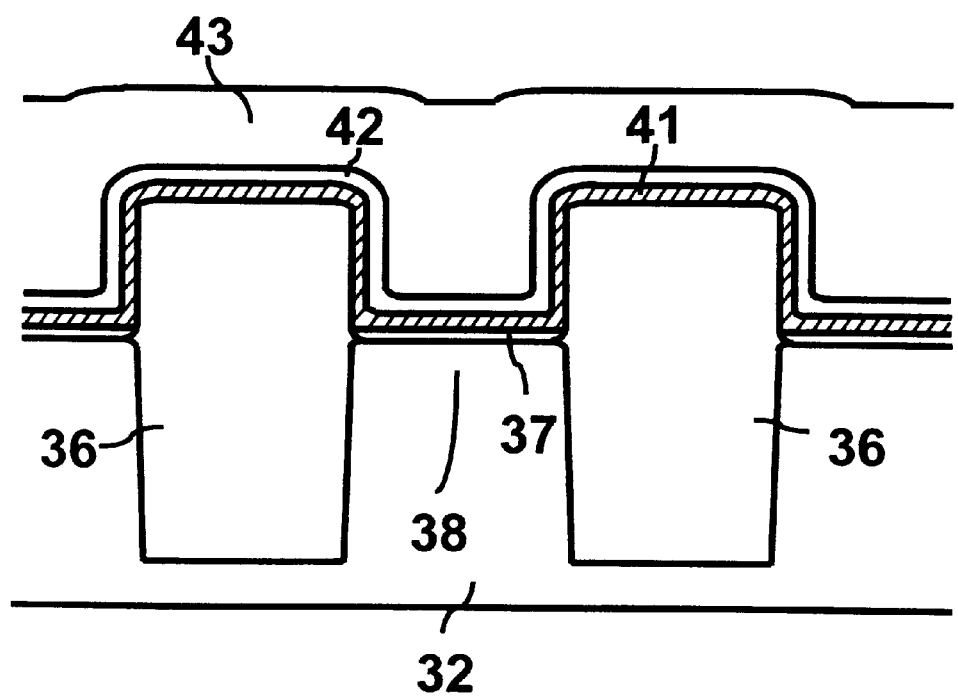

After the isolation oxide regions are formed, the pad oxide and the nitride layers are stripped away, and a gate or tunnel oxide 37 is formed on active areas 38, as illustrated in FIG. 3B. The gate oxide is thermally grown and has a thickness on the order of 70–250 Å.

A silicon layer 41 is then deposited on the gate oxide and the isolation oxide, and a nitride film 42 is deposited on the silicon. The silicon layer has a thickness on the order of 100–1000 Å, and can be either polysilicon or amorphous silicon. The silicon is preferably doped with phosphorus, arsenic or boron to a level on the order of $10^{17}$ to $10^{20}$ per $cm^3$. The doping can be done in-situ during deposition of the silicon or by ion implantation through the nitride.

Figure 3C:
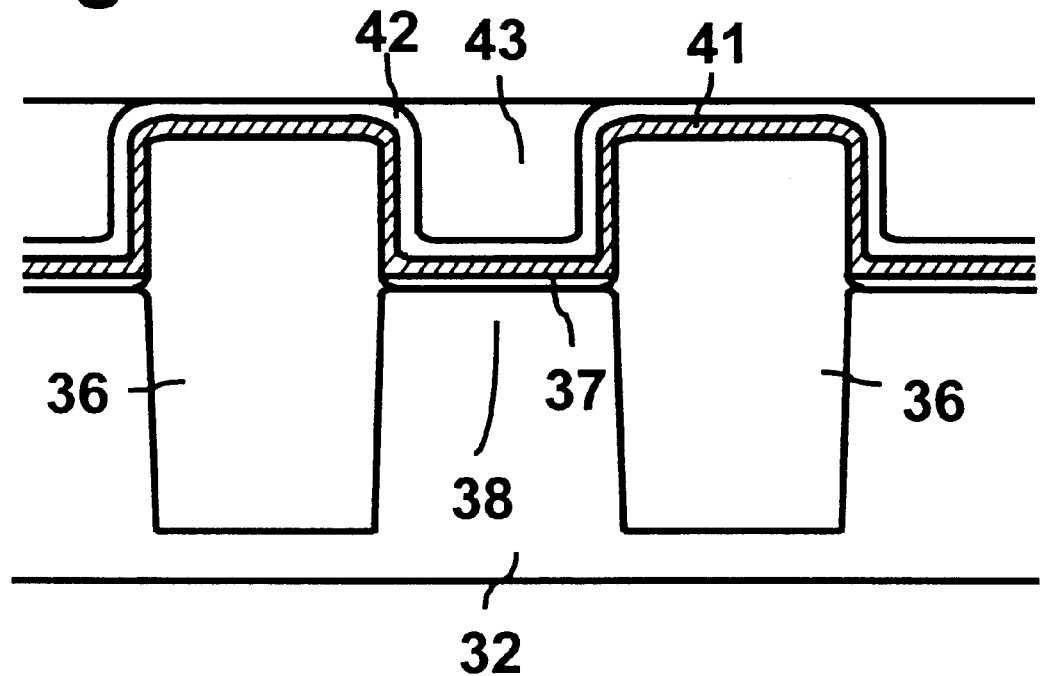
Figure 3D:
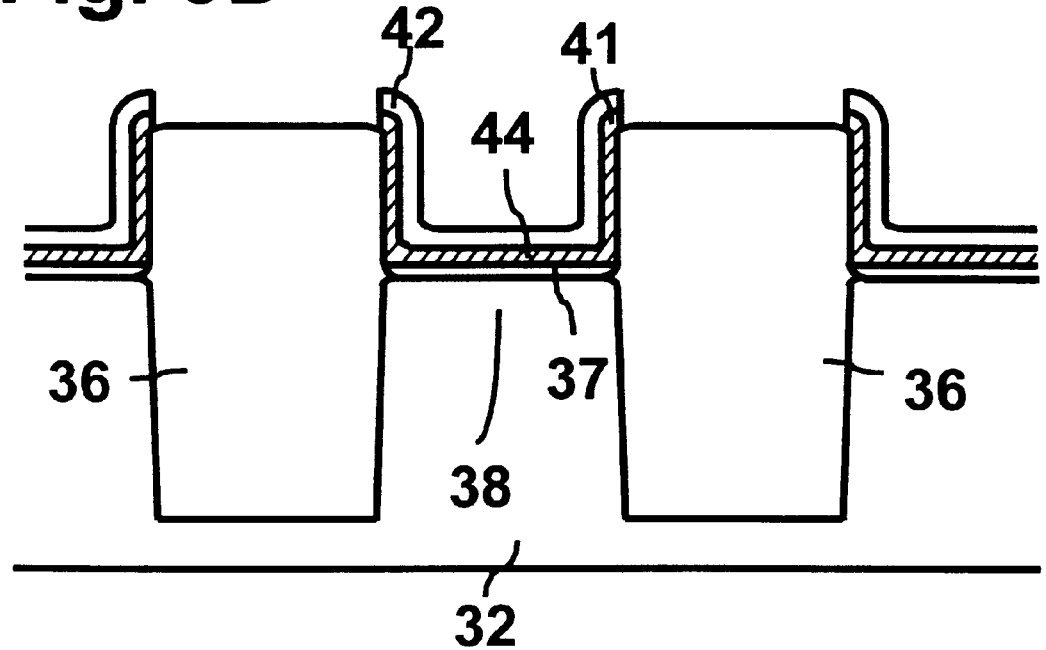

A silicon-on-glass (SOG) or CVD oxide 43 is deposited over the nitride film, and planarized by SOG etch back or CMP polishing to the level of the upper surface of the nitride film over the isolation oxide 36, as illustrated in FIG. 3C. That leaves oxide 43 only in the regions above active areas 38, and using that oxide as a mask, the nitride film is etched away anisotropically in the areas over the isolation oxide. The remaining SOG or CVD oxide is then etched away with a wet chemical solution, exposing the nitride 42 in the active areas. Using that nitride as a mask, the silicon 41 above the isolation oxide is removed by an anisotropic dry etch, as shown in FIG. 3D, leaving the silicon only in the active areas to form floating gates 44. Those gates extend along the top surface of gate oxide 37 and along the side edges of the isolation oxide.

Figure 4:
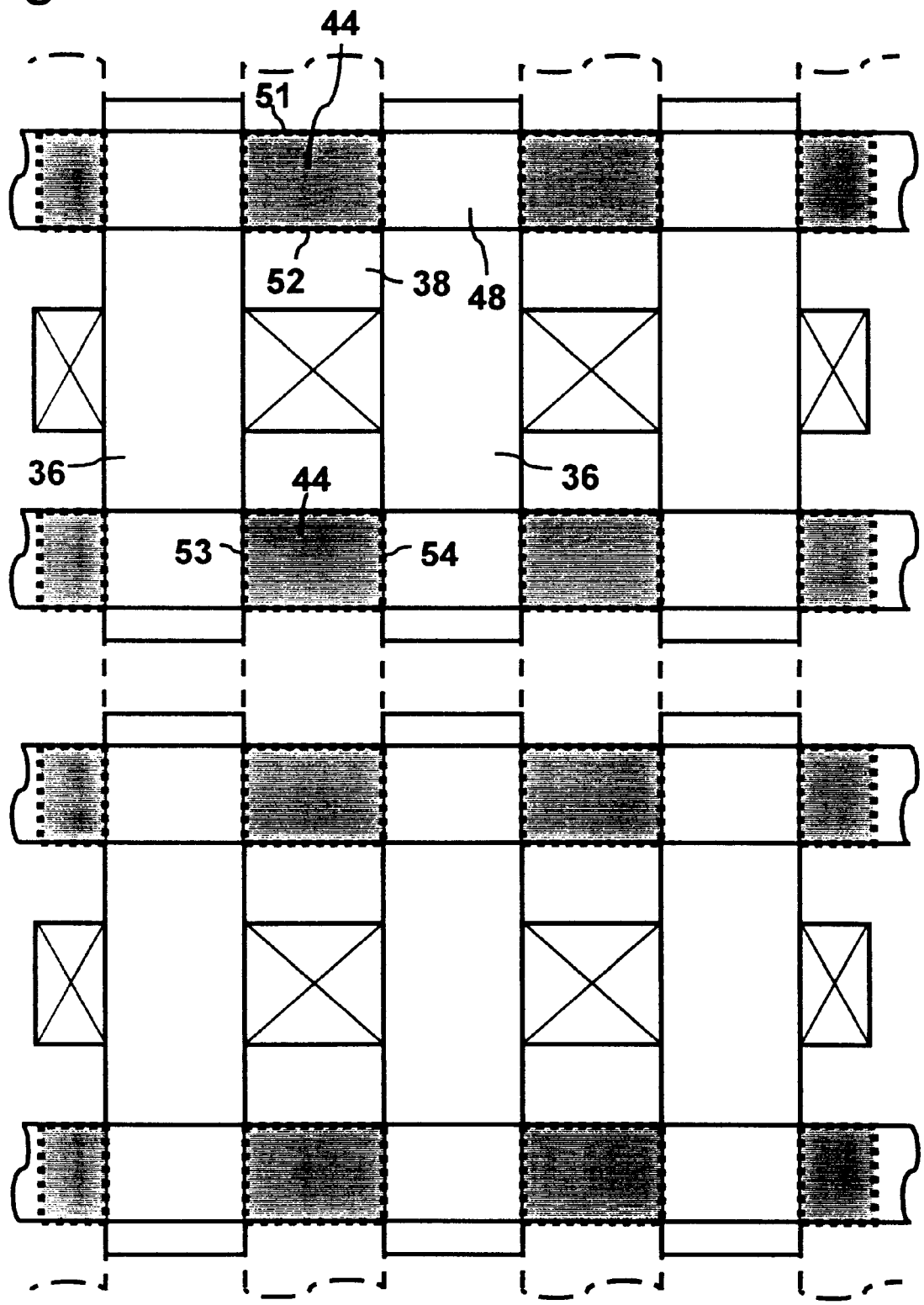
FIG. 4 is a schematic top plan of a stack-gate memory device manufactured in accordance with the process of FIGS. 3A–3E.
Figure 5A:
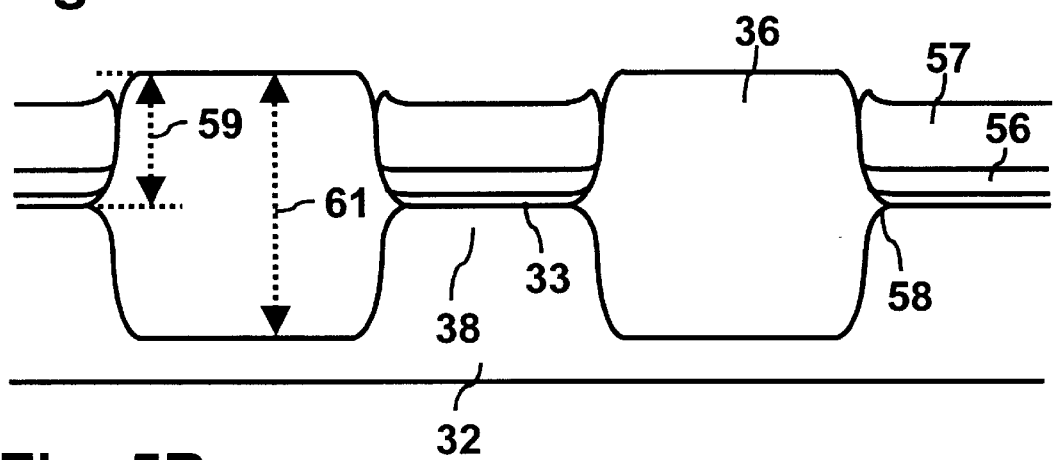
Figure 5B:
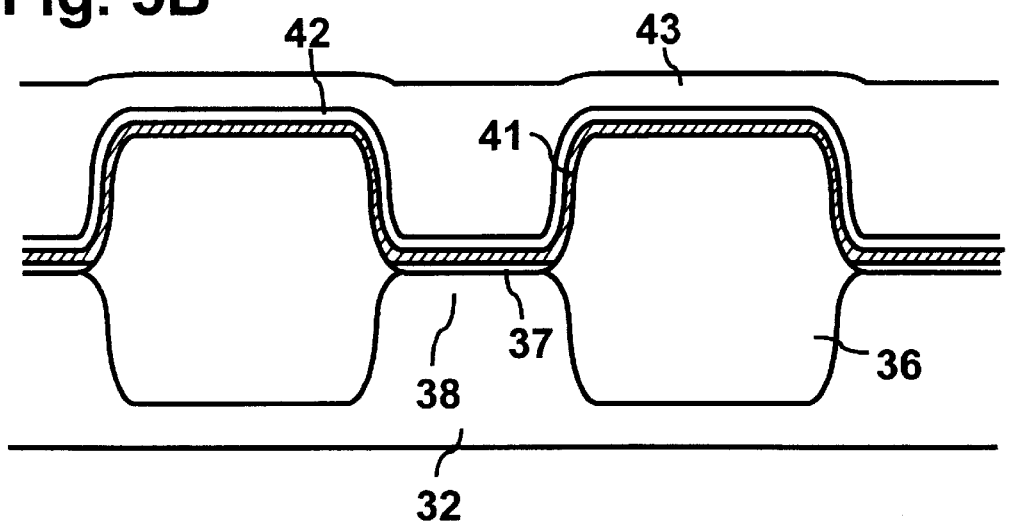
Figure 5C:
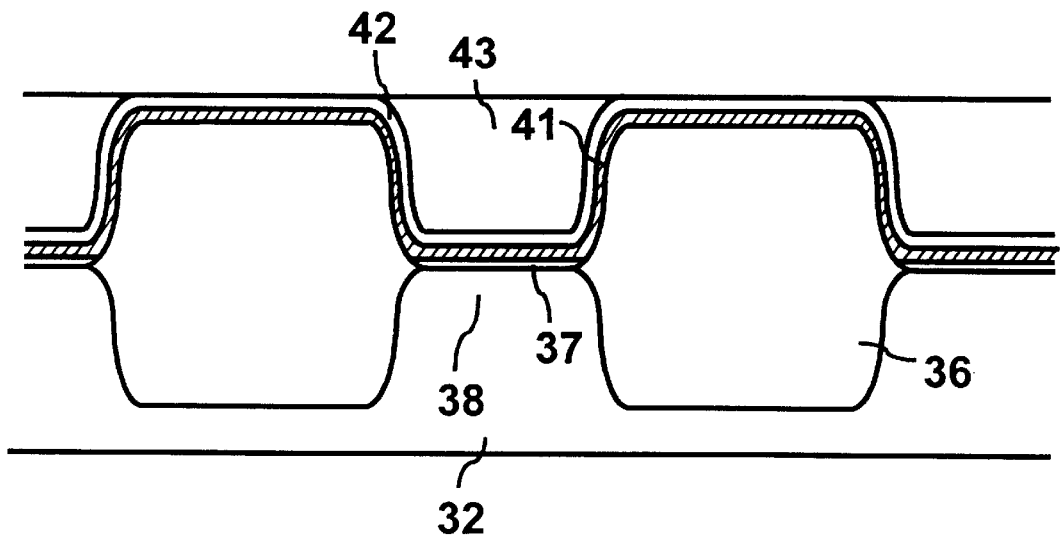
Figure 5D:
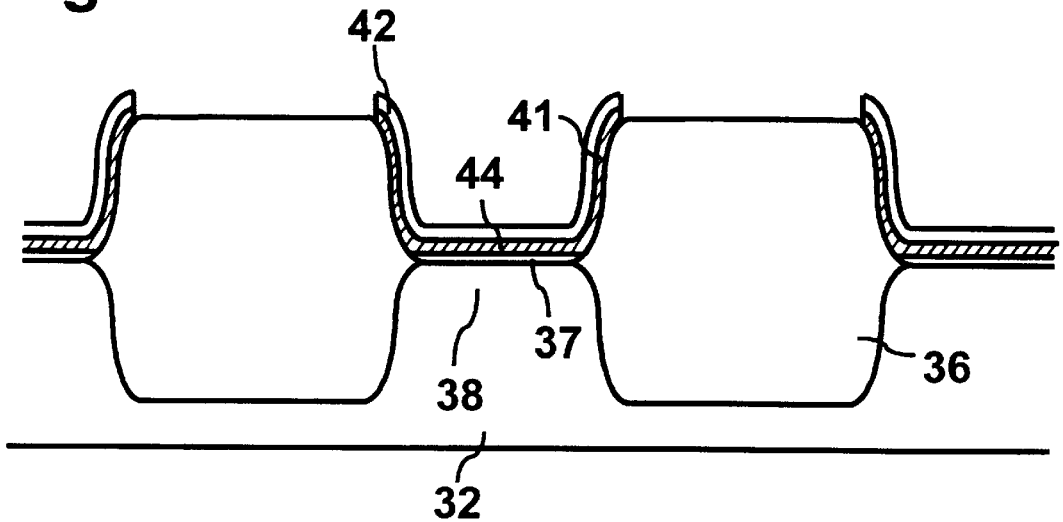
Figure 6:
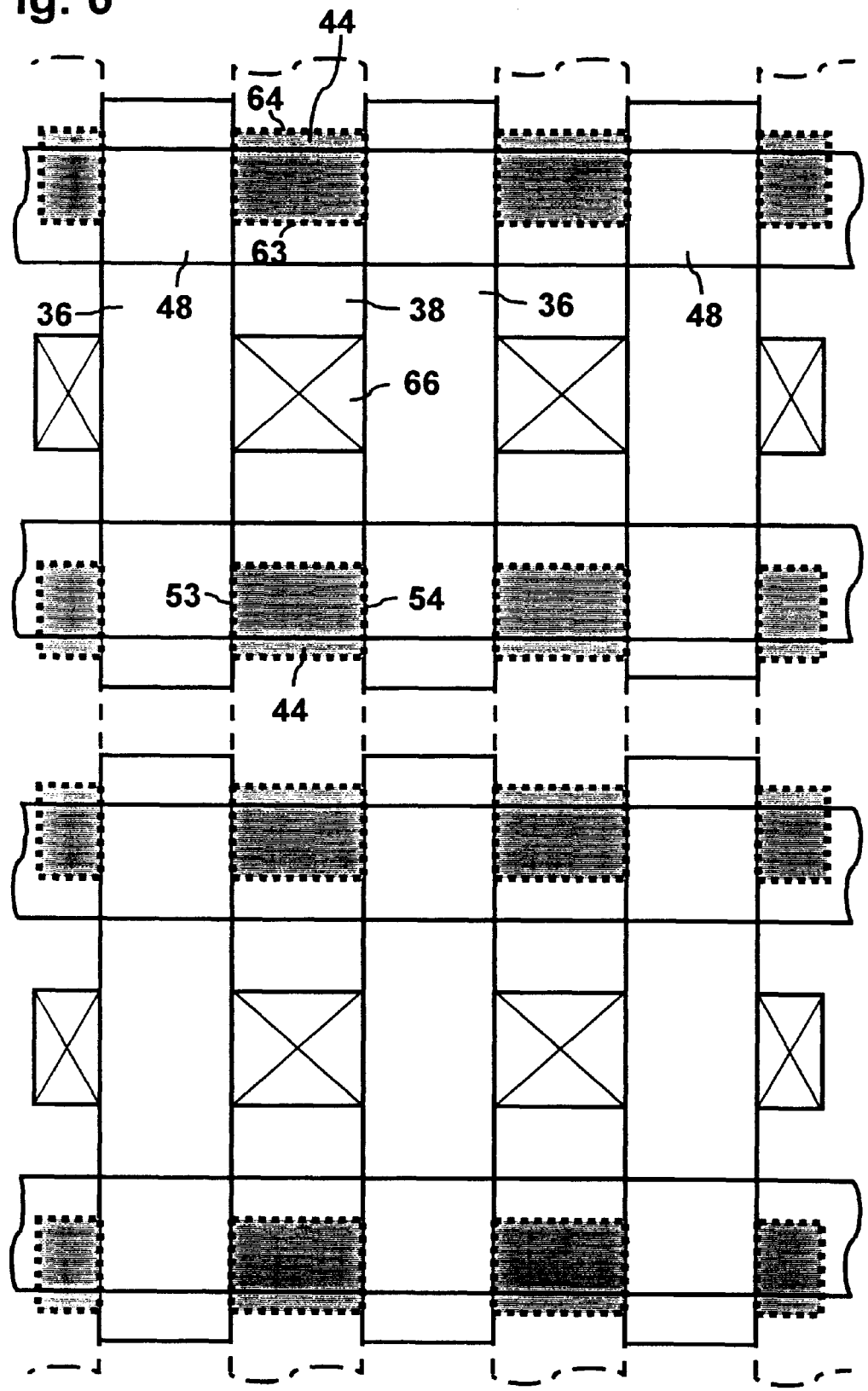
FIG. 6 is a schematic top plan of a split-gate memory device manufactured in accordance with the process of FIGS. 5A–5E.

As illustrated in FIG. 3E, once the floating gates have been formed, the nitride which covers them is stripped away, and a dielectric film 46 is deposited over the floating gates and the isolation oxide. That film is preferably an ONO (oxide/nitride/oxide) film, but it can also be a pure oxide or another combination of oxide and nitride. A layer 47 of polysilicon or polycide (e.g., tungsten silicide) is deposited over the dielectric film and patterned to form the control gates 48, as illustrated in FIG. 4.

The control gates are patterned by means of a photolithographic mask (not shown) which also defines the edges 51, 52 of the floating gates which extend across active areas 38. The two silicon layers and the dielectric layer in the unmasked areas are then etched away anisotropically, leaving control gates 48 and floating gates 44, with edges 51, 52 of the floating gates being self-aligned with the corresponding edges of the control gates. The other two edges 53, 54 of the floating gates are self-aligned with the side edges of the isolation oxide.

The capacitance areas between the control gates and the floating gates can be made relatively large by making silicon layer 41 relatively thin and increasing the height of the side walls 44a of the floating gates. In the embodiment illustrated, the height of the side walls 44a is on the order of 80 to 160 percent of the width of the bottom wall 44b of the floating gate. This provides a large coupling ratio so that voltages can be coupled efficiently from the control gates to the floating gates, and the memory cells can maintain a robust write and erase performance without floating gate caps over the isolation oxide.

The process illustrated in FIGS. 5A–5E is generally similar to the process of FIGS. 3A–3E except that it uses LOCOS (local oxidation of silicon) isolation rather than shallow trench isolation. Like reference numerals designate corresponding elements in the devices made by the two processes.

In this embodiment, after the pad oxide 33 is formed on the substrate 32, a polysilicon layer 56 is formed on the pad oxide, and a nitride layer 57 is formed on the polysilicon layer. The isolation oxide 36 is thermally grown, with the shortest possible bird's beak 58 projecting laterally from the oxide. The height 59 of the isolation oxide above the substrate is important in providing the floating gate with a high side wall and a large coupling capacitance between the control gate and the floating gate. In the embodiment illustrated, the height of the isolation oxide above the substrate is on the order of 55 percent of the total height 61 of the oxide.

After the isolation oxide regions are formed, the pad oxide, polysilicon and nitride are stripped away, and the gate oxide 37 is thermally grown on the active areas 38. Thereafter, the silicon layer 41, nitride layer 42 and SOG or CVD oxide 43 are deposited as in the embodiment of FIGS. 3A–3E, and the SOG or CVD oxide is planarized to a level even with the upper surface of the nitride over the isolation oxide, thus leaving the SOG or CVD oxide 43 only in the active areas.

As in the embodiment of FIGS. 3A–3E, the nitride above the isolation oxide 36 is etched away, using the SOG or CVD oxide as a mask. The SOG or CVD oxide is then removed from the active areas with a wet etching solution, and using the remaining nitride 42 as a mask, the silicon 41 above the isolation oxide is etched away, leaving the silicon only in the active regions.

The nitride 42 covering the silicon in the active regions is stripped away, and a photolithographic mask is employed to define one or both of the sides 63, 64 of the floating gates 44 which extend across the active regions 38. If only one side is defined, it is the side 63 which faces toward contact 66, ard the other side 64 is delineated during formation of the control gate pattern. After the floating gate mask is defined, the silicon in the unmasked areas is etched away anisotropically.

The dielectric film 46 is deposited over the remaining silicon and the isolation oxide, and the second silicon layer 47 is deposited on the dielectric film. That layer can be formed of polysilicon which preferably is heavily doped with phosphorus, arsenic or boron to a level on the order of $10^{20}$ to $10^{21}$ per $cm^3$. The doping can be done either by in-situ doping during deposition or by ion implantation. Alternatively, a polycide such as tungsten silicide can be used instead of polysilicon.

After the second silicon layer is formed, another photolithographic mask is employed to define the control gate pattern. Following pattern definition, the unmasked portions of the layer are etched away anisotropically to form the control gates 48. Where the second sides 64 of the floating gates have not already been formed, the anisotropic etching continues through the dielectric film 46 and silicon layer 42 to complete the floating gate pattern.

As in the device manufactured by the process of FIGS. 3A–3E, the floating gates have relatively high side walls 44a which, in the embodiment illustrated, are on the order of 80 to 160 percent of the width of the bottom wall 44b. This provides a relatively large area for capacitive coupling with the control gates and results in a large coupling ratio so that voltages can be coupled efficiently from the control gates to the floating gates. As a result, the memory cells can maintain a robust write and erase performance without floating gate caps over the isolation oxide.

Figure 7A:
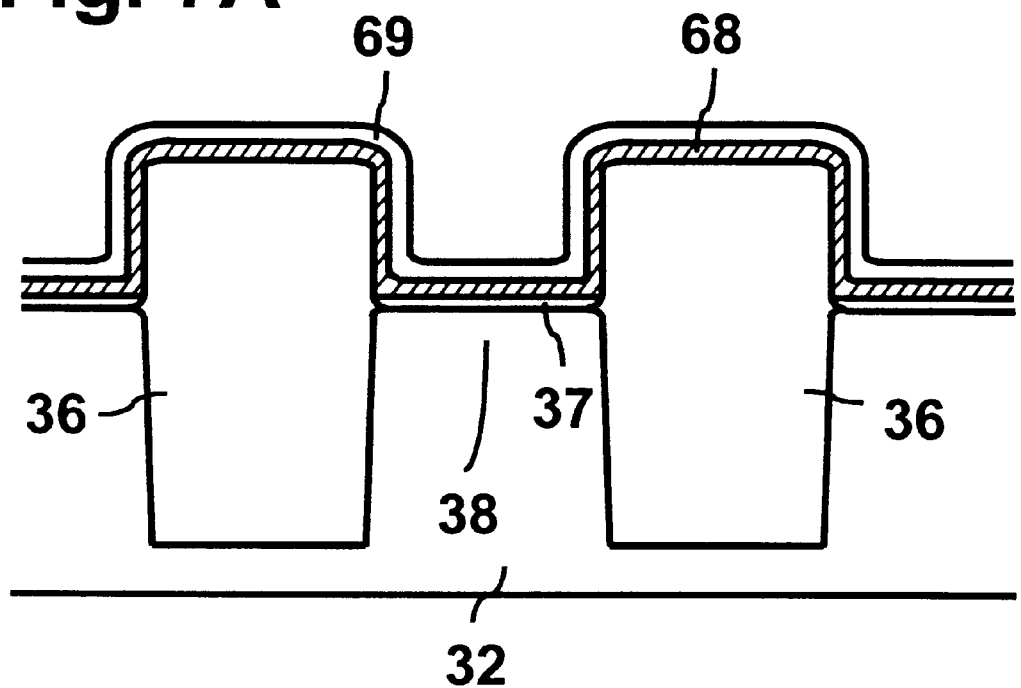
FIGS. 7A and 7B are schematic cross sectional views illustrating the steps in another embodiment of a process for fabricating a nonvolatile memory device using shallow trench isolation in accordance with the invention.
Figure 7B:
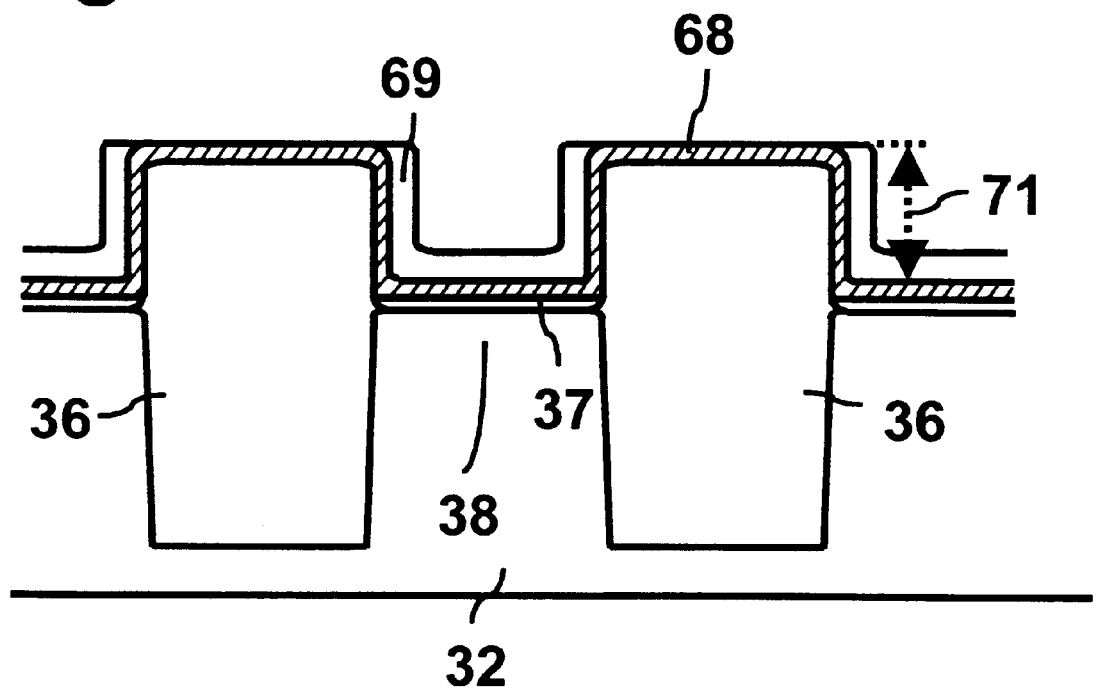

FIGS. 7A and 7B illustrate another process for forming a self-aligned floating gate using CMP polishing and shallow trench isolation. Isolation oxide regions 36 are formed as described above, and gate oxide 37 is grown on the active regions 38. A layer 68 of polysilicon or amorphous silicon is deposited over the gate oxide and the isolation oxide. This layer has a thickness on the order of 100–1000 Å, and is doped with phosphorus, arsenic or boron to a level on the order of $10^{17}$ to $10^{20}$ per cm$^3$. A nitride layer 69 which also has a thickness on the order of 100–1000 Å is deposited on the silicon.

In the case where the silicon is very thin, e.g. less than about 500 Å, and is doped by ion implantation, it is preferable to implant the ions through the nitride so that most of the implanted ions are distributed into the silicon, rather than penetrating into the gate oxide and/or the silicon substrate.

A CMP polishing operation is then performed to remove the nitride 69 above the isolation oxide to a level at or slightly below the upper surface of the silicon 68 on the isolation oxide, as illustrated in FIG. 7B. Using the nitride remaining in the active areas as a mask, the silicon above the isolation oxide is anisotropically etched away. The control gates, the dielectric film between the control gates and the floating gates, and the remaining edges of the floating gates are formed as in the process of FIGS. 3A–3E.

Figure 8A:
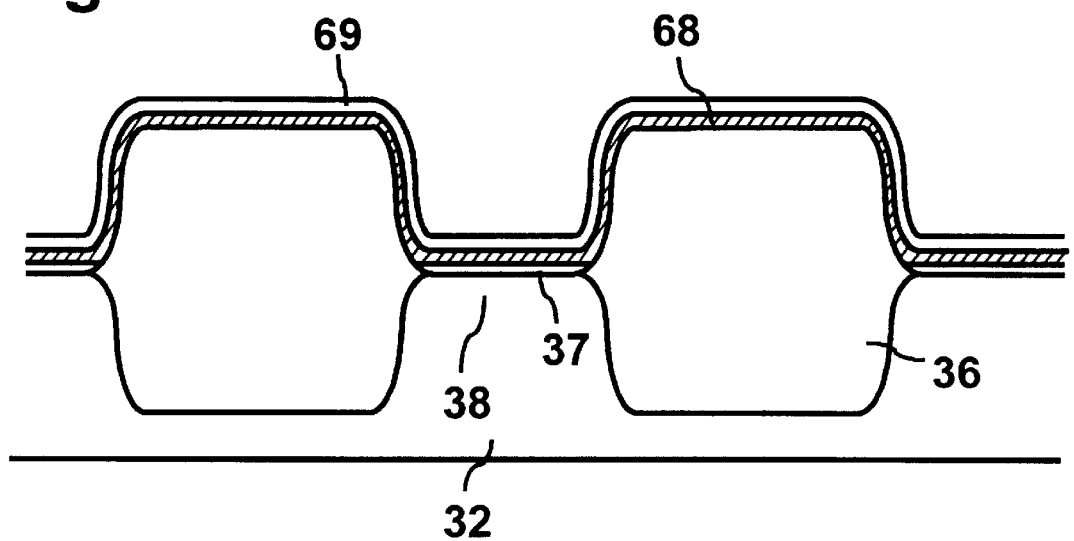
FIGS. 8A and 8B are schematic cross sectional views illustrating the steps in another embodiment of a process for fabricating a nonvolatile memory device using LOCOS isolation in accordance with the invention.
Figure 8B:
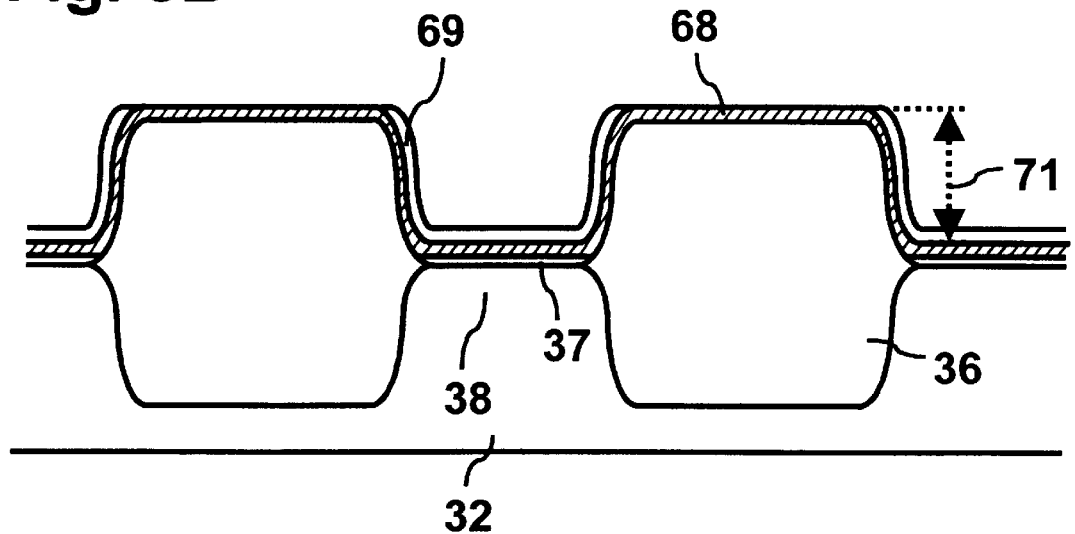

FIGS. 8A and 8B illustrate a process which is substantially identical to the process of FIGS. 7A and 7B, except that the isolation oxide regions are formed by a LOCOS process, rather than shallow trenching. Once the isolation oxide regions are formed, the remaining steps are substantially identical, and like reference numerals designate corresponding elements in the devices produced by the two processes. Thus, gate oxide 37 is grown on the substrate, silicon layer 68 is deposited over the gate oxide and the isolation oxide, and nitride layer 69 is deposited on the silicon.

The nitride above the isolation oxide is removed by CMP polishing, and the remaining nitride is used as a mask in etching away the silicon above the isolation oxide. The control gates, the dielectric film between the control gates and the floating gates, and the remaining edges of the floating gates are formed as in the process of FIGS. 3A–3E.

The invention has a number of important features and advantages. The relatively thin floating gate with high side walls provides a large coupling capacitance between the control gate and the floating gate, which provides robust write and erase operation without the end caps required by prior art devices. Eliminating the end caps significantly reduces the size of the memory cells and the array. Moreover, process yield fluctuation caused by pattern shifting and corner-rounding are eliminated, resulting in better and more stable process yields.

The processes of FIGS. 7A–7B and 8A–8B have the further advantage that the thin silicon on the isolation oxide regions can be etched entirely during the silicon etch by adding an over-etch step, and at the same time the height 71 of the side wall of the silicon can be accurately controlled. This is important in maintaining a large capacitance between the control gate and the floating gate to get the desired amount of coupling. Moreover, the nitride also serves to protect the thin silicon layer and the underlying thin gate oxide from contamination during the CMP polishing step.

It is apparent from the foregoing that a new and improved semiconductor device and process have been provided. While only certain presently preferred embodiments have been described in detail, as will be apparent to those familiar with the art, certain changes and modifications can be made without departing from the scope of the invention as defined by the following claims.

What is claimed is:

1. In a process for fabricating a semiconductor device, the steps of: forming a temporary layer over an active area in a substrate, patterning the temporary layer to form a mask, etching through the mask to form trenches in the substrate on opposite sides of the active area, depositing an isolation oxide in the trenches and on the temporary layer, planarizing the isolation oxide to the height of the temporary layer, removing the temporary layer, forming a gate oxide layer over the active area, depositing a first layer of silicon on the gate oxide and along the sides of the isolation oxide to form a floating gate, forming a dielectric film on the floating gate, and depositing a second layer of silicon on the dielectric film to form a control gate which is capacitively coupled with the floating gate.

2. The process of claim 1 wherein the temporary layer is formed to a height above the substrate on the order of 80 to 160 percent of the width of the active area, and the bottom and side walls of the floating gate are formed to have a thickness on the order of 100 to 1000 Å.

3. In a process for fabricating a semiconductor device, the steps of: forming a temporary layer over an active area in a substrate, growing an isolation oxide on opposite sides of the active area, removing the temporary layer, forming a gate oxide layer over the active area, forming a floating gate on the oxide layer and along the side of the isolation oxide, forming a dielectric film on the floating gate, and depositing a second layer of silicon on the dielectric film to form a control gate which is capacitively coupled with the floating gate.

4. In a process for fabricating a semiconductor device having a floating gate, the steps of: forming an isolation oxide on a substrate on opposite sides of an active region, forming a gate oxide on the substrate in the active region, depositing a first layer of silicon on the gate oxide and on the sides and top of the isolation oxide, forming a layer of nitride on the first layer of silicon, forming a temporary oxide on the nitride layer, planarizing the temporary oxide to the top of the nitride to expose the nitride above the isolation oxide and leaving the temporary oxide in the active region, etching away the nitride above the isolation oxide using the temporary oxide as a mask and leaving the nitride in the active region, removing the temporary oxide from the nitride in the active region, etching away the silicon above the isolation oxide using the nitride in the active region as a mask and leaving the silicon in the active region to form a floating gate which is aligned with the sides of the isolation oxide, removing the nitride from the active region to expose the floating gate, forming a dielectric film on the floating gate and on the isolation oxide, depositing a second layer of silicon on the dielectric film, and patterning the second layer of silicon to form a control gate which is coupled capacitively with the floating gate through the dielectric film.

5. The process of claim 4 including the steps of positioning a mask above the second silicon layer, and etching the control gate and the floating gate through the mask to form aligned side edges on the two gates.

6. The process of claim 4 including the steps of forming a side edge on the floating gate by etching through a first mask before the second layer of silicon is formed, and etching through a second mask during the patterning of the second layer to form a side edge on the floating gate.

7. In a process for fabricating a semiconductor device having a floating gate, the steps of: forming isolation regions on a substrate on opposite sides of an active region, forming a gate oxide on the substrate in the active region, depositing a first layer of silicon on the gate oxide and on the sides and top of the isolation regions, forming a layer of nitride on the first layer of silicon, planarizing the nitride to the level of the silicon above the isolation regions, etching away the silicon above the isolation regions using the nitride in the active region as a mask and leaving the silicon in the active region to form a floating gate, removing the nitride from the floating gate, forming a dielectric film over the floating gate and the isolation regions, forming a second layer of silicon over the dielectric film, and patterning the second layer to form a control gate.

8. The process of claim 7 including the step of doping the first layer of silicon with a dopant selected from the group consisting of phosphorus, arsenic and boron.

9. The process of claim 8 wherein the first layer of silicon is doped by implanting ions through the nitride layer.

10. The process of claim 3 wherein the oxide regions are grown to be about 55 percent above the surface of the substrate and about 45 percent below the surface.

* * * * *